United States Patent [19]

Reents et al.

[11] Patent Number: 5,561,384
[45] Date of Patent: Oct. 1, 1996

[54] INPUT/OUTPUT DRIVER CIRCUIT FOR ISOLATING WITH MINIMAL POWER CONSUMPTION A PERIPHERAL COMPONENT FROM A CORE SECTION

[75] Inventors: Daniel B. Reents, Dripping Springs; Michael S. Quimby; Carl K. Wakeland, both of Austin, all of Tex.

[73] Assignee: Advanced Micro Devices, Inc., Sunnyvale, Calif.

[21] Appl. No.: 555,217

[22] Filed: Nov. 8, 1995

[51] Int. Cl.⁶ ............................................... H03K 3/00
[52] U.S. Cl. ..................... 327/108; 327/544; 327/564; 327/566
[58] Field of Search ............................ 327/108, 544, 327/564, 566

[56] References Cited

U.S. PATENT DOCUMENTS 5,450,027  9/1995  Gabara .......................... 327/544

Primary Examiner—Margaret Rose Wambach
Attorney, Agent, or Firm—Kevin L. Daffer

[57] ABSTRACT

Within an integrated circuit, an input/output driver circuit is provided. The input/output driver circuit is configured to provide electrical isolation and power savings when the integrated circuit is configured into a computer system such as a personal information device. By providing a mechanism permitting removal of power from the driver circuit, the integrated circuit inhibits current flow from the integrated circuit into a powered-down peripheral device. A force term is activated, when electrical isolation is desired, to inhibit current flow into or from the integrated circuit via an input/output pad voltage level. A power savings is enabled by allowing the power down of peripheral devices coupled to the integrated circuit without the need for external buffer circuits.

15 Claims, 10 Drawing Sheets

INPUT/OUTPUT DRIVER CIRCUIT FOR ISOLATING WITH MINIMAL POWER CONSUMPTION A PERIPHERAL COMPONENT FROM A CORE SECTION

BACKGROUND OF THE INVENTION

1. Field of the Invention

This invention relates to a personal computer (PC) system and more particularly to an input/output driver circuit and a core section embodied upon a single monolithic substrate. The input/output driver circuit includes transistor devices which selectively connect or disconnect an input/output pad to the core unit based on the presence or absence of power upon the input/output driver circuit. To minimize power consumption, the input/output pin is further driven to ground by the input/output circuit during times in which power is removed from the input/output driver circuit.

2. Description of the Relevant Art

Personal information devices (herein referred to as PIDs) are well known in the industry. Typically, a PID includes any computer-based device which can store and manipulate data according to a user-defined program. Common types of PIDs are: notebook computers, subnotebook computers, digital assistants (test units, meters, etc.), electronic calendars, organizers, "smart" phones, etc. Depending upon their usage, PIDs are instrumental as a portable tool for communicating, computing and generally organizing day to day activities of a user.

PIDs typically employ both an AC power supply and/or battery pack (primary power source) as well as a backup power supply (secondary power source). The battery pack allows the PID operation remote from an AC plug in. Hence, the device enables a user to reference and manipulate information stored within the PID at a client's place of business, at the user's home, or while the user is traveling, for example.

At a minimum, a PID is implemented using a set of basic subsystems including: a central processing unit (CPU), an input/output structure, a memory, a control bus, a data bus and an address bus. Each of the above basic subsystems of the PID can be embodied upon separate silicon substrates or upon a single monolithic substrate, as an "integrated circuit". When one of the subsystems included upon the integrated circuit is the CPU, the integrated circuit is referred to as an "integrated processor". Depending upon the complexity of the PID, additional subsystems can be added to the basic subsystems listed above. Further, the basic subsystems as well as the additional subsystems can be configured upon the same silicon substrate as the integrated processor.

One of the basic subsystems included in a PID, as mentioned above, is a memory. The memory is typically composed of dynamic random access memory, or DRAM. DRAM has the requirement that each memory cell be refreshed. Refresh is a process wherein the contents of the memory cell are transferred out and subsequently transferred back into the memory cell. Refresh is required because capacitors associated with the cells cannot permanently retain voltage. The voltage represents the value stored in the cell, and thus the value can be lost over time. Because a given cell is not guaranteed to be accessed within a given amount of time by the natural operation of the system, refresh logic is included in either the memory controller that is typically coupled to the DRAM, included within the DRAM itself, or coupled to some combination of the memory controller and/or the DRAM. Two typical refresh schemes are CAS before RAS refresh and self refresh.

In CAS before RAS refresh, two interface signals between the DRAM and its controller are driven active in the opposite order of a normal access. During normal read or write accesses to a DRAM, RAS is driven active and then later CAS is driven active. RAS before CAS signaling causes the DRAM to transfer the contents of a requested memory location to its associated output. However, if CAS is driven active and then later RAS is driven active (i.e. CAS before RAS), the DRAM interprets the request as a refresh request. Subsequently, a refresh occurs in accordance with an incremented register within the DRAM. By periodically using the refresh signalling technique, a computer system can keep the entire DRAM refreshed and each memory cell will continue to maintain the value that was last stored into it by the memory controller.

In self refresh, the DRAM is signaled to begin refresh similar to the CAS before RAS refresh scheme, wherein CAS is driven active followed by RAS. However, using a self refresh scheme will allow the DRAM to continuously execute refresh cycles until CAS and RAS are driven inactive. Conversely, only one refresh cycle is preformed in DRAMS using CAS before RAS refresh for each CAS/RAS activation cycle.

The basic subsystems listed above are included in the IBM-compatible, AT-style personal computer (PC) architecture. The AT architecture is a well-known and popular configuration for various PIDs, and has enjoyed widespread acceptance in the computer industry as evidenced by its use in a large majority of the PCs currently being sold. In addition to the basic subsystems listed above, AT-style PCs employ expanded basic subsystems necessary for specific PID applications. In addition to other subsystems, an AT-style system used as a PID include the following expanded basic subsystems: a real time clock (RTC) unit and configuration static random access memory (configuration RAM).

The RTC unit serves to maintain time and date information within the PID. Typically, the RTC unit is adapted to receive an oscillator input for incrementing the RTC register value. The oscillator input is normally driven by an external oscillator crystal which is configured to oscillate at a defined frequency. The RTC register is then read by an operating system at boot time, and the read value is used to update the time and date values associated with the operating system running upon the integrated processor. The operating system then maintains the time and date during normal operation.

Configuration RAM maintains information regarding many of the subsystems (components) coupled within or to the integrated processor and forming the PID. Exemplary information maintained within the configuration RAM includes the number and size of fixed disk drives, the size of main memory coupled to the CPU, information about various peripheral components installed in the expansion slots, etc. The user or manufacturer of the PID defines the configuration of the components when the PID is first powered on, whereby application of power causes information storage into the configuration RAM. Whenever components are updated, added or removed from the PID, the configuration RAM is changed to reflect the new status of the PID components. Accordingly, the PID can always determine information about components currently installed by examining the information stored in the configuration RAM. Configuration RAM is well known in the industry and is commonly termed "CMOS RAM".

In order for the aforementioned RTC unit to maintain accurate time and date information, and the configuration RAM to maintain the current configuration information, these expanded basic subsystems must remain powered even when the remaining subsystems are powered off. Early PIDs employ a separate battery (secondary power source), typically a lithium cell, to supply power to the RTC unit and configuration RAM while the remaining subsystems are selectively powered by the primary source. In the above configuration, power is always drawn from the secondary power source regardless of the PID power state.

Various semiconductor manufacturers have produced integrated circuits that have integrated the RTC unit, the configuration RAM, and the battery cell into a single integrated circuit. It would be advantageous in a PID to include the RTC unit and the configuration RAM with other subsystems on a single integrated circuit. Such integration provides enhanced minimization and reduces the number of separate (discrete) subsystems required to build a PID. Reducing the number of discrete subsystems and placing as many subsystems as possible on a single monolithic substrate lowers the cost of the PID. However, an integrated circuit of this type would require an apparatus which can reset the basic subsystems and additional subsystems to a known state without disturbing the contents of the expanded basic subsystems such as the RTC unit and configuration RAM. Furthermore, an integrated circuit which includes such subsystems requires selective power capability (i.e. an apparatus which can apply power to the RTC unit and configuration RAM during times when the remaining integrated subsystems are powered off). If such an apparatus is not provided, the contents of the configuration RAM and the real time clock sections would be lost each time the PID is powered down or reset.

In addition to needing selective power capabilities, PIDs must also provide high performance while utilizing low power. The low power requirement exists because the PID is configured to operate from a battery pack. Subsystems which operate at lower power will therefore function for a longer period of time than higher power subsystems. Several power management techniques have been implemented by PID manufacturers to accomplish low power designs.

One such power management technique is to lower the voltage provided to the integrated circuits that comprise subsystems of a PID. However, the lowest voltage that can be used is limited by a number of factors, including noise margin and the semiconductor technology that was used to manufacture the integrated circuits. Noise margin refers to the resilience of a circuit to the presence of random fluctuations in the electrical signals which are used to communicate within the circuit.

Another power management technique typically used within an integrated circuit is to temporarily disable the clock signal to circuits that are idle for a period of time. With the clock signal stopped, the inputs to the circuit will be held constant and thus no switching of the circuits will occur. In many semiconductor technologies, such as CMOS, very little power is used if no switching occurs.

Another power management technique is to remove the power input from peripheral devices when those devices are idle for a period of time. The term "peripheral component" or "peripheral device" refers to an electronic component which is coupled to a peripheral controller linked to a peripheral bus. The peripheral controller is defined as an additional subsystem. Peripheral devices and associated peripheral controllers are not critical to PID functionality, but nonetheless expand functionality of the PID when included. Exemplary peripheral devices are fixed disk drives, PCMCIA devices, etc. Due to the nature of subsystems integrated as an integrated circuit, powering off of peripheral components requires a buffer inserted between the peripheral component and the integrated circuits which interface to the peripheral component when the peripheral component is to be powered off while connected to other components which remain powered on.

Integrated circuits are typically divided into a core section and one or more input/output driver sections. The core section includes circuits necessary to provide the basic, expanded, and additional subsystem functions of the integrated circuit. Each input/output driver section provides the interface between the core and a corresponding peripheral device. Thus, the input/output driver section is coupled between the core and pins on the exterior of the package containing the integrated circuit.

One or more input/output driver circuits included in an input/output driver section typically contain a transistor for driving a pin associated with an input/output driver section to a voltage representing a logical one. Another transistor is included for driving the pin to a voltage representing a logical zero. In some driver circuits, the inputs to the logical one and logical zero-driving transistors are configured to be off simultaneously at certain times. Such a configuration is known as a "tri-state" driver. The term "tri-state" means that the associated input/output pin may take on three values: logical one, logical zero, and unknown (or floating). The floating or unknown value may correspond to any voltage.

If a peripheral component attached to an input/output pin of an integrated circuit having input/output drivers as described above is to be powered off, then it is necessary to prevent the integrated circuit from driving current (via an output signal through an input/output pin) into the powered down device. Such current could damage the integrated circuit or the receiving peripheral component. The external buffer is used to prevent this damage. The input/output pins of the integrated circuit are coupled to one side of the buffer, and the pins of the peripheral component are coupled to the opposite side of the buffer. A control input to the buffer is provided. When the control input is in the connect state, the respective input/output pins of the two devices are coupled together. However, when the control input is in the disconnect state, the respective input/output pins of the two devices are not coupled together. Thus, when a peripheral component is powered down, the control inputs of the buffers associated with that component are driven to the disconnect state and the integrated circuit is electrically isolated from the peripheral component.

Unfortunately, the buffers that are required to enable peripheral component power off are costly. Also, controlling the buffer requires extra signals to be added to the PID, also possibly adding cost. A solution for powering down peripheral components without requiring external buffers in a PID is needed.

SUMMARY OF THE INVENTION

The problems outlined above are in large part solved by an input/output driver circuit according to the present invention. The driver circuit comprises a driving-high transistor, a driving-low transistor, a pull-up transistor, a pull-down transistor, and a force term signal coupled to the gate of the pull-down transistor. The driving-high and driving-low transistors are used to provide a power conductor voltage and a ground voltage, respectively, on an input/output pad coupled to the transistors. The pull-up transistor provides the power conductor voltage to the input/output pad when the driving-high and driving-low transistors are deactivated. The pull-down transistor provides a ground voltage on the input/output pad when the force term signal is active.

The driver circuit of the present invention provides electrical isolation on an integrated circuit including a core and a plurality of input/output driver sections wherein the driver sections comprise one or more input/output driver circuits. When power is removed from the power conductor coupled to the driver circuit, the driver circuit is tri-stated (or floating) wherein no voltage level is forcibly maintained on the input/output pad. Therefore, no current will flow from the integrated circuit into a powered-down peripheral component that is coupled to the integrated circuit through the driver circuit. By activating the force term, the input/output pad voltage level is pulled to the ground voltage. Therefore, current flow into the integrated circuit core due to the input/output pad voltage level is also stopped, and electrical isolation has been achieved.

The driver circuit of the present invention further provides economical power savings by allowing the powering down of peripheral devices coupled to the driver circuit. Previously, costly external buffer devices were inserted between the integrated circuit and the peripheral device to provide peripheral power down capability. Because the driver circuit provides electrical isolation between the integrated circuit core and the peripheral device, no buffer devices are needed. The driver circuit provides the buffering, and ensures no current flow between the peripheral device and the integrated circuit.

The present invention contemplates an integrated circuit comprising a force term signal and an input/output driver circuit interposed between a core section and an input/output pad. The input/output driver circuit comprises a pull-up transistor connected between a power source and the input/output pad, as well as a pull-down transistor connected between a ground and the input/output pad. The force term signal is connected to the gate of the pull-down transistor and is activated during times when a partial reset is detected by the integrated circuit.

The present invention further contemplates an input/output driver circuit coupled between a core section and an input/output pad. The input/output driver circuit comprises: selectively operable pull-up and pull-down transistors connected in series between a first power source and a ground; selectively operable driving-high and driving-low transistors connected in series between the ground and the first power source as well as a clamped second power source; and a mechanism for permitting deactivation of the first and second power sources and for activating the pull-down transistor at substantially the same time.

BRIEF DESCRIPTION OF THE DRAWINGS

Other objects and advantages of the invention will become apparent upon reading the following detailed description and upon reference to the accompanying drawings in which.

Figure 1:
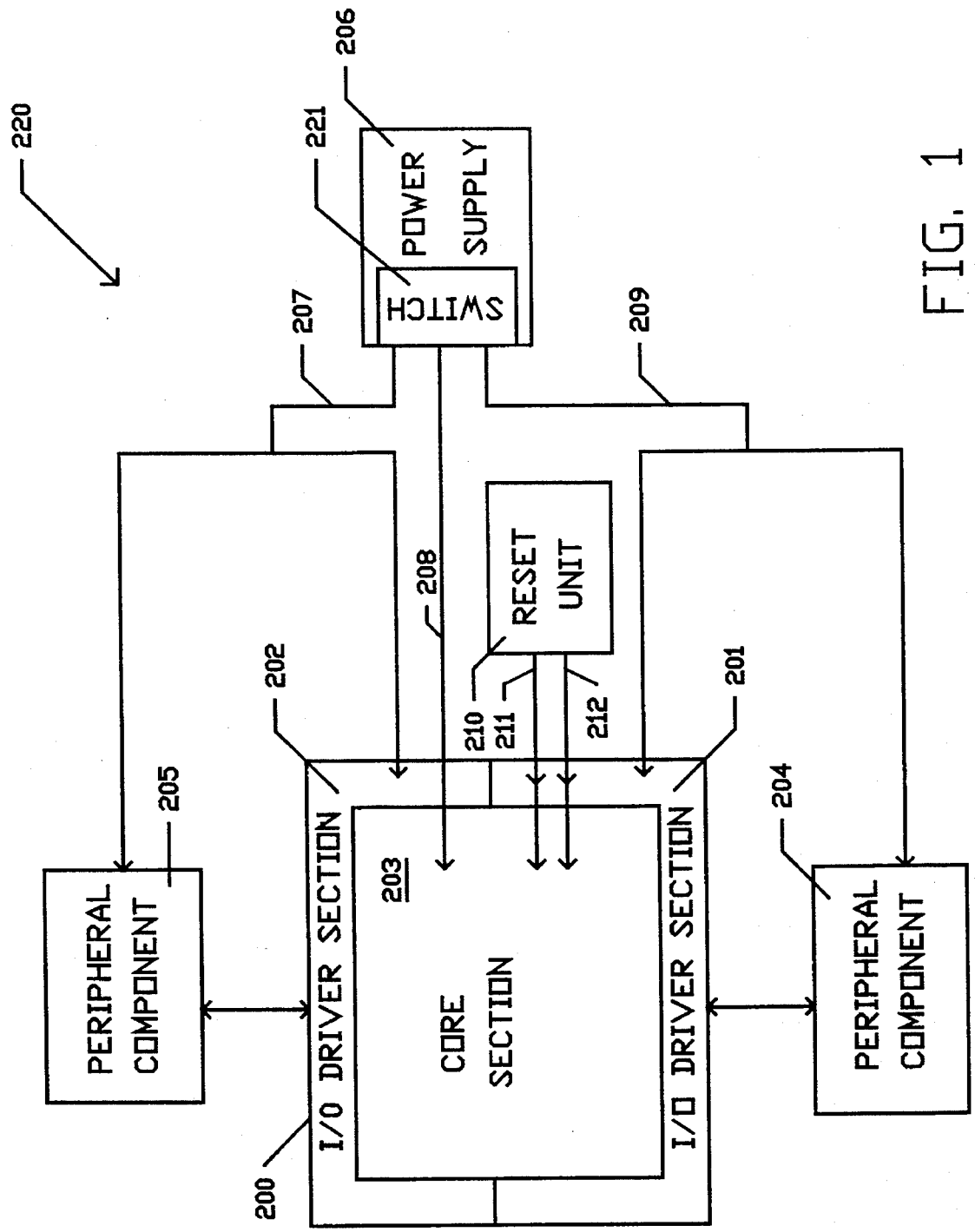
FIG. 1 is a block diagram of an integrated circuit according to one embodiment of the present invention, wherein the integrated circuit is coupled into a personal information device (PID) having a power supply, a reset unit, and two peripheral components.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 4:
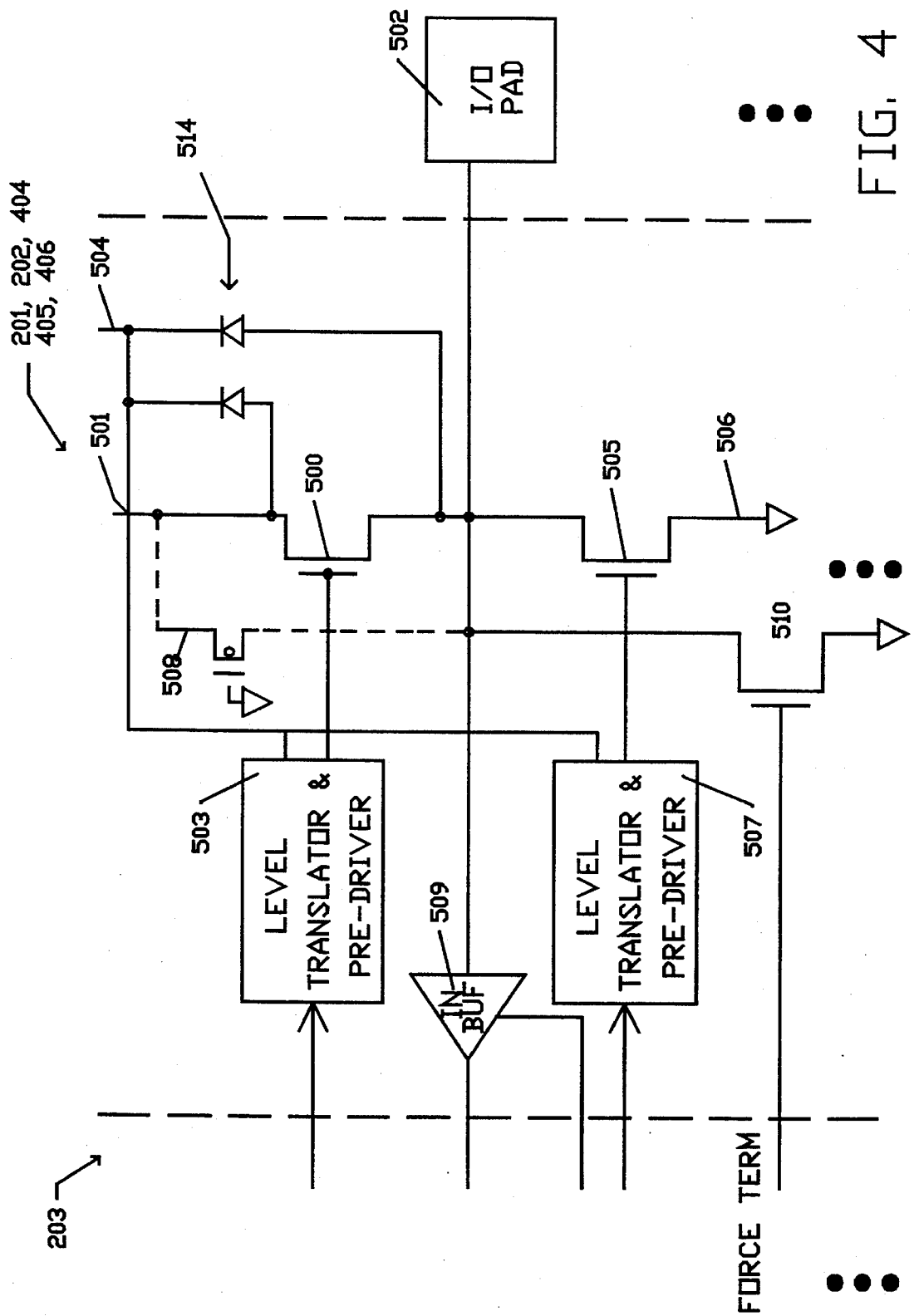
FIG. 4 is a circuit diagram of an input/output circuit of the present invention.

Turning now to FIG. 1, an embodiment of an integrated circuit 200 is shown in a PID 220. Integrated circuit 200 is configured with two input/output driver sections 201 and 202, and a core section 203. Core 203 contains circuits that implement the subsystem functions of the integrated circuit and is coupled to driver sections 201 and 202. Each input/output driver section 201 or 202 contains at least one driver circuit (a driver circuit is shown in FIG. 4). The driver circuit enables communication between core 203 and a respective peripheral component. Input/output driver sections 201 and 202 and core 203 are each further configured with separate and distinct power inputs. Peripheral component 204 is coupled to input/output driver section 201, and peripheral component 205 is coupled to input/output driver section 202. Exemplary peripheral components 204 and 205 include DRAM memory, PCMCIA cards, fixed disk drives, etc.

Power is supplied, during use, to integrated circuit 200 and peripheral components 204 and 205 by power supply 206. In this embodiment, power supply 206 is configured with three power conductors. A first power conductor 207 is coupled to the power inputs of peripheral component 205 and driver section 202. A second power conductor 208 is coupled to the power input of core 203. A third power conductor 209 is coupled to the power inputs of driver section 201 and peripheral component 204. It is understood that other embodiments of power supply 206 may be configured with varying numbers of power conductors.

Referring again to FIG. 1, a reset unit 210 is shown configured with two reset output conductors 211 and 212. Reset conductors 211 and 212 are coupled to core 203 via input/output section 201. A signal upon conductor 211 is used to force core 203 into a known initial state from which core 203 will act in a predefined manner to provide its subsystem functions. Core 203 requires a reset, for example, when power is first applied to a PID embodying integrated circuit 200. It is understood that reset unit 210 may be part of power supply 206.

In one embodiment, power supply 206 can terminate power on conductor 207 in order to conserve power consumption of integrated circuit 200 and peripheral component 205. Various implementations of power supply 206 are well known, and generally include a primary power source (having both an AC power coupling and a battery pack), a secondary power source, and a switch (shown in FIG. 1 as reference numeral 221). Switch 221, when in one position, applies power on conductors 207, 208, and 209 from the primary power source. In a second position, switch 221 applies power on conductors 208 and 209 from the secondary power source, but terminates power on conductor 207. By removing power from conductor 207, peripheral component 205 and driver section 202 are powered off. Driver section 202 includes one or more driver circuits which function to "turn off" current flow from core 203 to peripheral component 205 during times in which power is applied on conductor 208 but removed from conductor 207. Input/output section 202 thereby suffices to electrically isolate core 203 from peripheral component 205.

The portion of core 203 coupled to driver section 202 requires reset when driver section 202 is powered off. Core 203 is designed to communicate with peripheral component 205, but cannot do so when driver section 202 and peripheral component 205 are, in the interest of power conservation, powered off. Power will further be conserved if the portion of core 203 coupled to driver section 202 remains reset (i.e. inactive) until peripheral component 205 is again powered on. Reset conductor 212 is provided for resetting portions of core 203. The process of powering off peripheral component 205 would then require at least the steps of: activating a signal on reset conductor 212 and removing power from conductor 207. The process of powering on peripheral component 205 would then require at least the steps of: applying power to conductor 207, waiting an amount of time (specified by the integrated circuit manufacturer) for power supply 206 to stabilize, and deactivating the signal on reset conductor 212. A suitable amount of time necessary before deactivating the reset signal is five microseconds. The powering off and powering on steps will be explained in more detail with reference to the timing diagrams set forth below.

To power down peripheral component 205 at a time when peripheral component 204 remains powered, driver section 202 must be powered off at a time when driver section 201 and core 203 remain powered. Providing separate and distinct power inputs to the driver sections enables this functionality. It is understood that, depending on the application, integrated circuit 200 may employ one or more than two input/output driver sections with separate power supplies provided to each.

Figure 2:
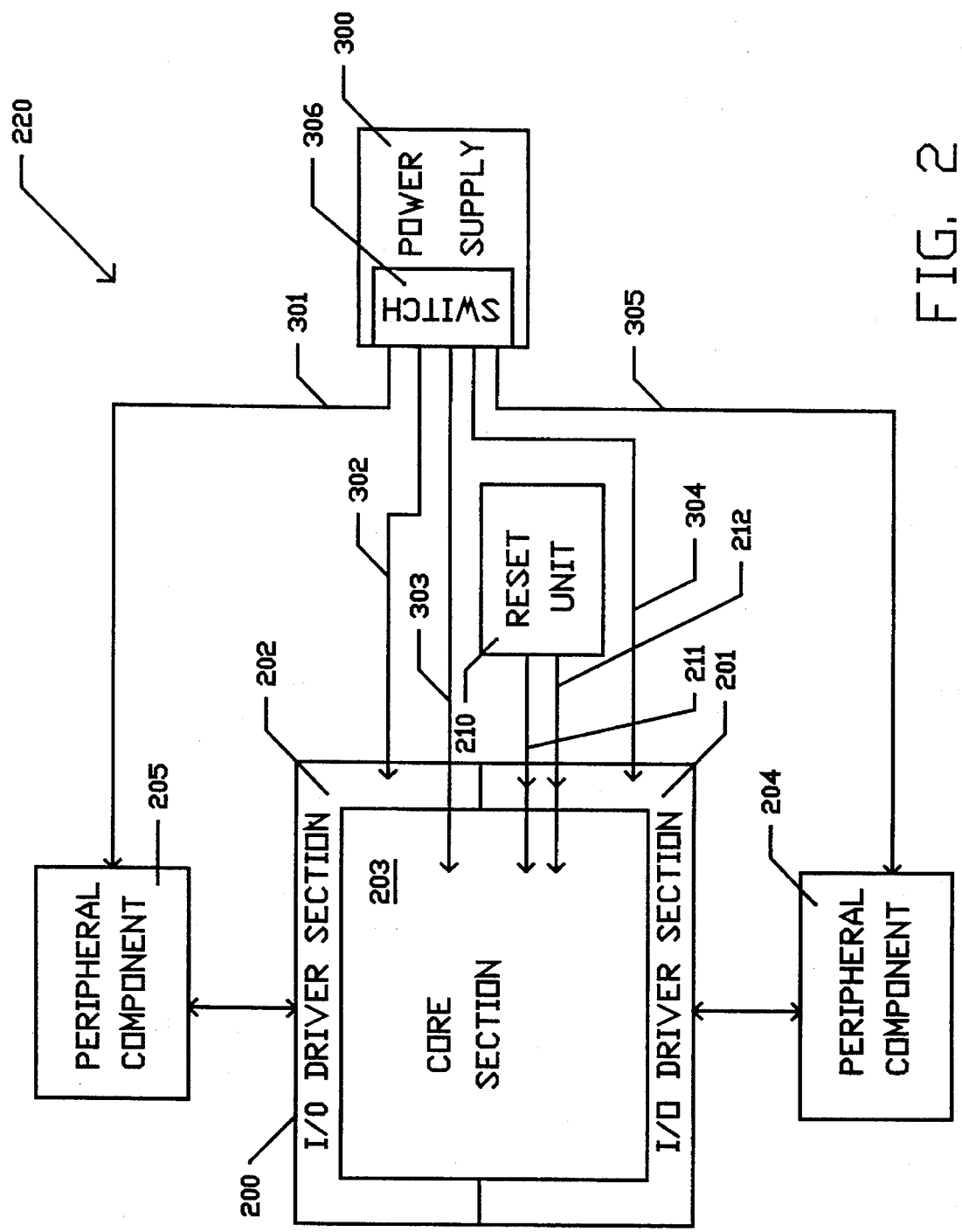
FIG. 2 is a block diagram of an integrated circuit according to another embodiment of the present invention, wherein the integrated circuit is coupled into a PID having a power supply, a reset unit, and two peripheral components.

Turning now to FIG. 2, integrated circuit 200 and peripheral components 204 and 205 are shown in an alternative embodiment to FIG. 1. As in the system shown in FIG. 1, peripheral components 204 and 205 are coupled to driver sections 201 and 202, respectively. Reset unit 210 is also configured with two reset conductors 211 and 212, which are coupled to core 203 through driver section 201. A power supply 300 is provided to apply power, during use, to driver sections 201 and 202, core 203, and peripheral components 204 and 205. Power supply 300 is shown with five power conductors 301, 302, 303, 304, and 305. Conductor 301 is coupled to the power input of peripheral component 205; conductor 302 is coupled to the power input of driver section 202; conductor 303 is coupled to the power input of core 203; conductor 304 is coupled to the power input of driver section 201; and conductor 305 is coupled to the power input of peripheral component 204.

The difference between FIGS. 1 and 2 is that the conductors 301 and 302 (coupled to peripheral component 205 and driver section 202 in FIG. 2) are separate, whereas the peripheral component 205 and driver section 202 in FIG. 1 are fed by the same conductor 207. The conductors 304 and 305 (coupled to peripheral component 204 and driver section 201) are similarly separate in FIG. 2, whereas the peripheral component 204 and driver section 201 in FIG. 1 are fed by the same conductor 209. In the system of FIG. 2, the power on and power off sequences used for power conservation are applied coincidentally to conductors 301 and 302. Switch 306 is used to apply the power on and power off sequences. Power supply 300 may apply dissimilar voltage levels to conductors 301 and 302 for applications other than power conservation mode, if desired. Power supply 300 generally includes a primary power source and a secondary power source, similar to power supply 206. Switch 306 is used to switch between the primary power source (powering conductors 301, 302, 303, 304, and 305) and the secondary power source (powering conductors 303, 304, and 305).

Figure 3:
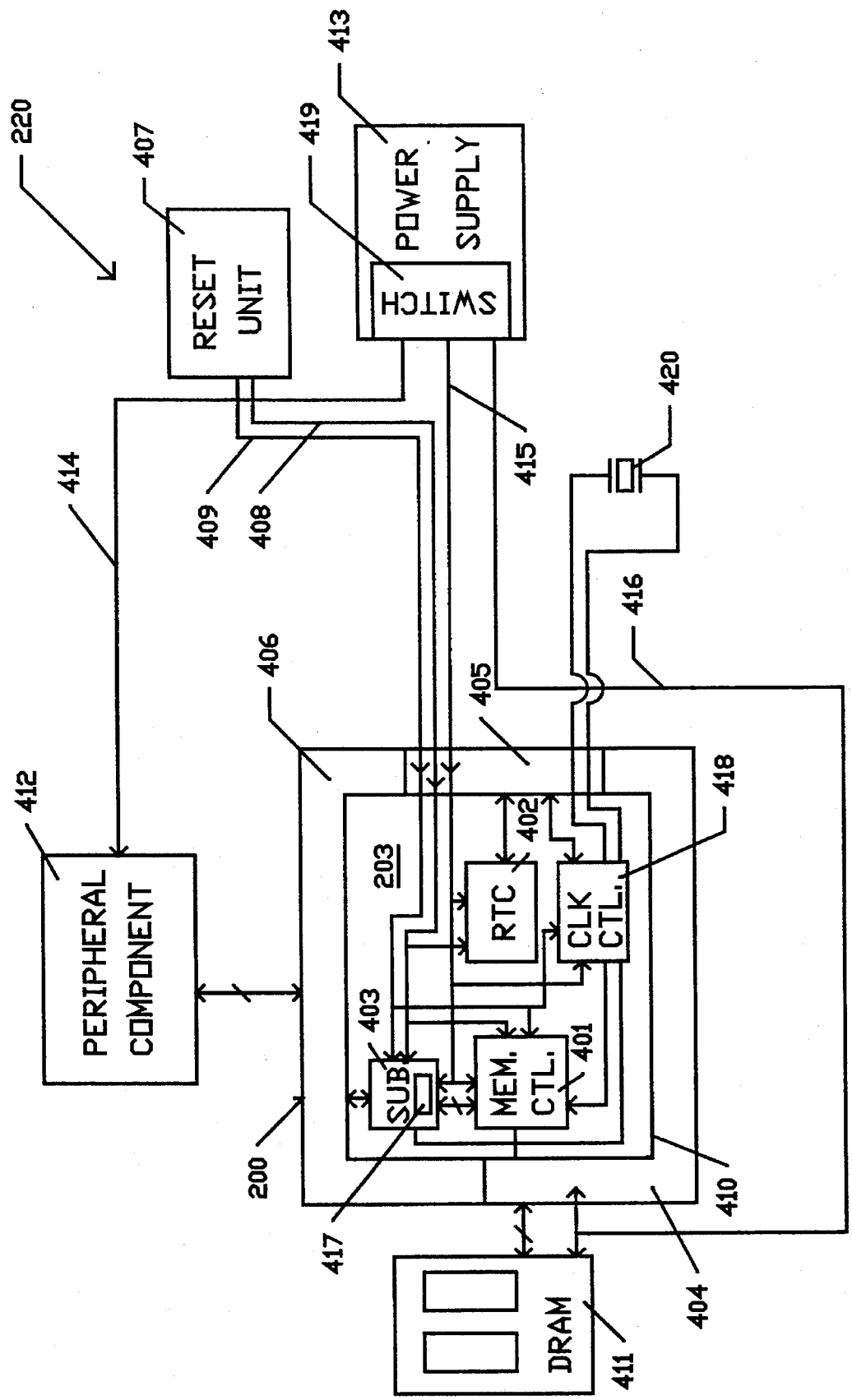
FIG. 3 is a block diagram of the integrated circuit according to yet another embodiment of the present invention, wherein the integrated circuit is coupled into a PID having a system DRAM, a reset unit, a power supply, and a peripheral component.

Turning now to FIG. 3, integrated circuit 200 is shown having subsystems configured within core 203. Integrated circuit 200 is configured with a memory control unit 401, an RTC unit 402, a subunit 403, and a clock control unit 418. Subunit 403 provides one or more of the basic, expanded basic, or additional subsystems that integrated circuit 200 is designed to provide. In one embodiment, subunit 403 can be a central processing unit (CPU) whereby integrated circuit 200 is an integrated processor. Memory control unit 401 is shown coupled to an input/output driver section 404; RTC unit 402 is shown coupled to input/output driver section 405; and subunit 403 is shown coupled between input/output driver section 406 and memory control unit 401.

Clock control unit 418 can comprise an oscillator circuit driven by an external crystal 420 and a phase locked loop (PLL) which generates the clocks for memory unit 401 and subunit 403. Clock control unit 418 is further configured to disable the clock outputs to subunit 403 and, if desired, to disable the clock to memory control unit 401 during power conservation mode. Power conservation mode is entered when a reset signal on reset conductor 408 is inactive and a reset signal on reset conductor 409 transitions active. Reset conductor 408 is coupled to each of the subsystems within core 203. Therefore, reset conductor 408 carries a "master reset" signal that causes the entire integrated circuit 200 to be reset. Herein, reset conductor 408 will be referred to as master reset conductor 408. Reset conductor 409 is coupled to subunit 403, memory control unit 401, and clock control unit 418. Therefore, reset conductor 409 cannot reset RTC unit 402. Reset conductor 409 carries a "partial reset" signal that causes certain subsystems of integrated circuit 200 to be reset. Herein, reset conductor 409 will be referred to as partial reset conductor 409. The phase locked loops remain powered on, but the outputs of the phase locked loops are disabled during power management mode. Additionally, the oscillator circuit portion of clock control unit 418 remains powered. The output of the oscillator remains active, continuing to clock RTC unit 402 and optionally memory control unit 401. Clock control unit 418 is coupled to input/output driver section 405 to receive an oscillator input (not shown) and partial reset conductor 409.

In one embodiment, memory control unit 401 is configured to interface with DRAM memory or static random access memory (SRAM). In particular, memory control unit 401 is configured to interface with DRAM memory that employs CAS before RAS refresh or self refresh. RTC unit 402 implements the real time clock and configuration RAM functions of the AT architecture.

The system shown in FIG. 3 additionally contains a reset unit 407, with master reset conductor 408 and partial reset conductor 409. It is understood that reset unit 407 is configured into power supply 413 in many typical embodiments. It is further understood that reset signals provided on reset conductors 408 and 409 are not required to be synchronous with respect to integrated circuit 200. That is, reset conductors 408 and 409 are not generated with respect to the clocks that are generated within integrated circuit 200. Resets 408 and 409 are asynchronous with respect to integrated circuit 200 operation. Reset conductors 408 and 409 are coupled to portions of core 203. The function provided by partial reset conductor 409 will now be described in further detail. Partial reset conductor 409 is not coupled to RTC unit 402, and therefore accurate time/date and configuration information can be maintained during a partial reset. Partial reset conductor 409 can be chosen to not affect memory control unit 401, as selected by a configuration bit in a configuration register 417 within subunit 403. The configuration bit is set by software after master reset conductor 408 has forced the integrated circuit to a known initial state, enabling or disabling DRAM refresh during power conservation mode. If the configuration bit is set, partial reset conductor 409 is inhibited from resetting memory control unit 401. Therefore, memory control unit 401 will continue providing refresh cycles to one or more DRAM modules 411. In this manner, DRAM modules 411 retain the data stored therein at times when integrated circuit 200 is in its power conservation mode. If the configuration bit is not set, partial reset conductor 409 is not inhibited from resetting memory control unit 401. Therefore, DRAM refresh is not provided during power conservation mode when the configuration bit is not set.

A second configuration bit in configuration register 417 indicates with one value that self refresh DRAMs are installed as DRAM modules 411. The second configuration bit indicates with the opposite value that CAS before RAS refresh DRAMS are installed as DRAM modules 411. It is noted that memory control unit 401 performs the same refresh type in many different power management modes.

The system shown in FIG. 3 further includes a peripheral component 412, coupled to input/output driver section 406. A power supply 413 is included having power conductors 414, 415, and 416. Conductor 414 is coupled to peripheral component 412 and driver section 406; conductor 415 is coupled to memory control unit 401, real time clock unit 402, subunit 403, the remainder of core section 203, and driver section 405; and, conductor 416 is coupled to DRAM modules 411 and driver section 404. Conductor 415 is used to continuously apply power for maintaining the configuration RAM and RTC information. Switch 419 is used to apply and remove power from conductor 414, similar to the operation of switch 221 (shown in FIG. 1) and switch 306 (shown in FIG. 2). Power supply 413 is also generally configured with a primary and secondary power source, and switch 419 is configured to switch between them. Particularly, switch 419 is configured to switch between the primary power source (applying power to conductors 414, 415, and 416) and the secondary power source (applying power to conductors 415 and 416). Switch 419 is further configured to power down conductor 416 if DRAM refresh is disabled.

Another system (not shown) could be configured with a conductor coupled to DRAM modules 411 and another, separate conductor coupled to input/output driver section 404. In such a system, switch 419 could be configured to power down the conductor coupled to input/output driver section 404 if self refresh DRAM modules are used for DRAM modules 411 and if the interface signals to DRAM modules 411 are held at logic zero levels required for self refresh mode.

In power conservation mode (that is, when conductor 414 and optionally conductor 416 is powered off) subunit 403 is maintained in reset state and memory control unit 401 is optionally maintained in reset state. If memory control unit 401 and subunit 403 are given separate power inputs so that they could be powered off at a time when RTC unit 402 is powered, then RTC unit 402 would require electrical isolation from memory control unit 401 and subunit 403. Without electrical isolation, significant leakage current could occur from RTC unit 402 to powered off areas of integrated circuit 200. Electrical isolation requires added silicon area, and therefore is provided only for the input/output sections. The amount of power drawn by subunit 403 and memory control unit 401 when maintained in a reset state and when not clocked by clock control unit 418 is insignificant. Therefore, power conservation is achieved without the costs of electrical isolation of units within the core of integrated circuit 200.

Turning now to FIG. 4, a circuit diagram is shown of an input/output driver circuit used within an input/output driver section of integrated circuit 200. The input/output driver circuit is coupled between sections of core 203 and corresponding input/output pads configured on the outside of integrated circuit 200. Each driver circuit is coupled to a single pad. Therefore, for each input/output driver section, one driver circuit is included for each of the pads (i.e., pins) associated with that input/output driver section. This embodiment of a driver circuit illustrates CMOS transistors, although it is understood that other embodiments may employ other types of transistors. A CMOS transistor has three coupling points: a drain, a source, and a gate. Electric current flows from the source to the drain when the gate is biased with respect to the source. For P-channel transistor activation, the gate must be negatively biased with respect to the source (i.e. a voltage applied to the gate must be lower than a voltage applied to the source). For N-channel transistor activation, the gate must be positively biased with respect to the source (i.e. a voltage applied to the gate must be higher than a voltage applied to the source).

Referring to FIG. 4, the input/output circuit includes a driving-high transistor 500. Driving-high transistor 500 has its source coupled to an input power supply conductor 501, its drain coupled to an input/output pad 502, and its gate coupled to a first level translator/predriver 503. Level translator/predriver 503 is further coupled to core 203. Core 203 drives a voltage corresponding to a logic level to translator/predriver 503. Translator/predriver 503 then translates the voltage from core 203 into a dissimilar voltage corresponding to a logical level for the gate of driving-high transistor 500. If the voltage provided at the gate of driving-high transistor 500 is an activation level, current from conductor 501 raises the voltage level of input/output pad 502 to the voltage level of conductor 501.

Input/output pad 502 is further coupled to an input/output pin (not shown) which is available on the exterior of the integrated circuit for coupling to interfacing devices. A clamp circuit 514 is used to prevent the voltage on input/output pad 502 from exceeding the voltage applied on conductor 504.

The input/output circuit of FIG. 4 further contains a driving-low transistor 505 with source coupled to input/output pad 502, drain coupled to a ground 506, and gate coupled to a second level translator/predriver 507. Level translator/predriver 507 is further coupled to core 203, which drives a voltage corresponding to a logical level into translator/predriver 507. Translator/predriver 507 converts the voltage provided by core 203 into a voltage corresponding to a logical level for the gate of driving-low transistor 505. If the voltage provided to the gate of driving-low transistor 505 corresponds to an activation level, then the voltage level on input/output pad 502 is lowered to the ground voltage 506. Note that when neither driving-high transistor 500 nor driving-low transistor 505 is active, the input/output pad 502 is in tri-state. Optionally included in the input/output circuit of FIG. 4 is a pull-up transistor 508. Pull-up transistor 508 is configured to maintain the voltage on input/output pad 502 at the voltage on conductor 501 when neither driving-low transistor 505 nor driving-high transistor 500 is active. Pull-up transistor 508 is a P-channel transistor, as well as driving-high transistor 500. Driving-low transistor 505 is an N-channel transistor.

Input buffer 509 is also included in the input/output circuit of FIG. 4. This buffer conveys the voltage on input/output pad 502 to the core. Transistor pull-down 510 is configured with source coupled to input/output pad 502, drain coupled to ground 506, and gate coupled to an input from core 203 (herein referred to as a "force termination" or "force term" or "force term signal"). When the integrated circuit enters power conservation mode, the power upon conductors 501 and 504 is powered off. When power on conductors 501 and 504 is powered off, the input/output node is in tri-state. Input buffer 509, when connected to a floating, tri-stated input, can draw a large amount of current. In this embodiment, core 203 drives the gate of transistor pull-down 510 to a logical one during power conservation mode. Pull-down transistor 510 drives the input/output pad 502 to ground voltage, removing the unknown tri-state value from input/output pad 502. Therefore, input buffer 509 will switch based on the defined ground voltage value and remain at that value, drawing an insignificant amount of current as long as pull-down transistor 510 remains active. The force term is derived by core 203 from sampling the values of master reset conductor 408 and partial reset conductor 409. If either reset conductor conveys an active reset value, then the force term is activated.

Note that the embodiments of FIGS. 1, 2, and 3 have shown one conductor coupled to each driver section and the power supply. However, it is understood from FIG. 4 that there are two power conductors associated with each input/output driver section: conductors 501 and 504. In cases where separate power inputs are coupled to conductor 501 and conductor 504, it is important that conductor 504 be powered on before or simultaneously to powering on conductor 501. If this procedure is not followed, the diodes of clamp circuit 514 will become "forward biased", a condition which causes large currents to flow through the diodes. The large current flow may cause damage to the device. Similarly, when powering the driver circuit off, it is important to power off conductor 501 before or simultaneously to powering off conductor 504.

Figure 5:
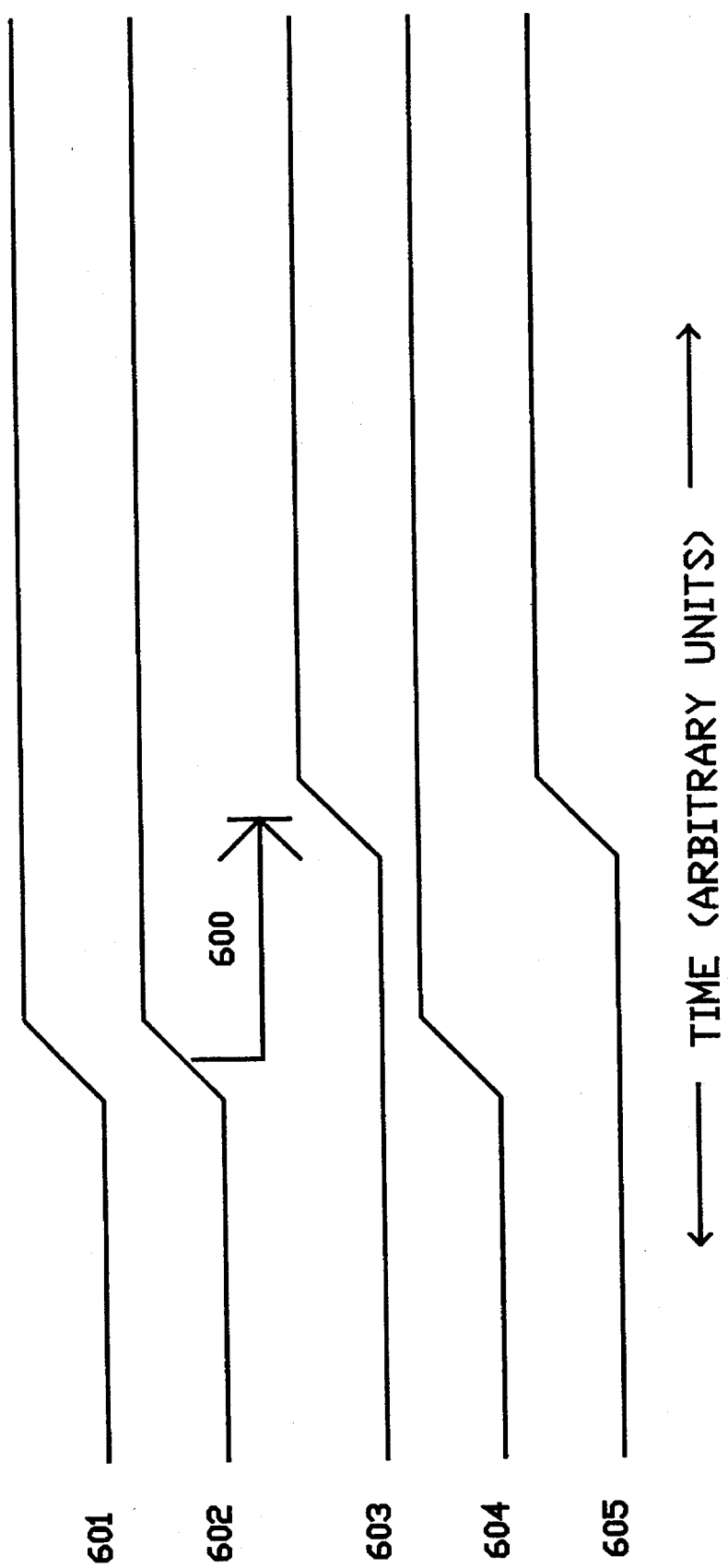
FIG. 5 is a timing diagram depicting a sequence of power and reset signals used for initiating integrated circuit power up.

Turning now to FIG. 5, a timing diagram is shown depicting signals used for initially powering up integrated circuit 200. The procedure shown in the timing diagrams applies to each of the embodiments described herein, but is described in particular with reference to the embodiment of FIG. 3. The power level carried on conductor 415 is shown as conductor signal 601; the power level carried on conductor 414 is shown as conductor signal 604; and the power level carried on conductor 416 is shown as conductor signal 602. These outputs must have power applied to them before the signal carried on master reset conductor 408 (shown as 603 on FIG. 5) transitions to the inactive value. This requirement ensures that the core of the integrated circuit is fully powered and stable for a time required for a proper reset to a known state to occur. The amount of time necessary in one embodiment is one second, and is represented on FIG. 5 as arrow 600. Also shown as signal 605 on the diagram is the signal carried on partial reset conductor 409. Signal 605 transitions to the inactive value at the same time as master reset conductor signal 603. Another important factor in powering the integrated circuit relates to the input/output driver circuit's two power inputs (as shown in FIG. 4). If conductor 501 and conductor 504 are powered by separate and distinct power supply conductors, it is important to apply power to conductor 504 before or simultaneous to applying power to conductor 501.

Figure 6:
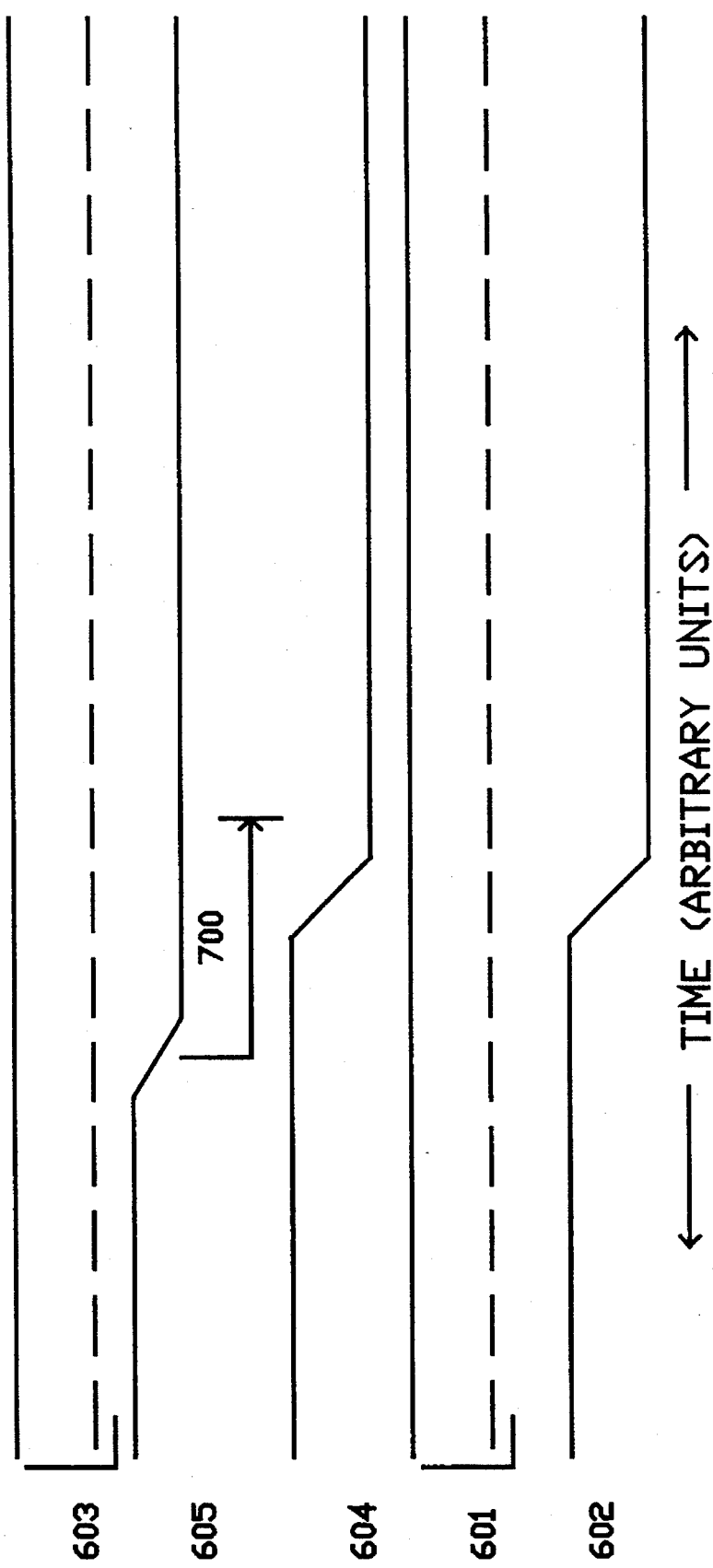
FIG. 6 is a timing diagram depicting a sequence of power and reset signal transitions for causing the integrated circuit shown in FIG. 3 (configured with DRAM refresh disabled during power conservation mode) to enter a power conservation mode of operation.

Turning now to FIG. 6, a timing diagram for entering power conservation mode with DRAM refresh disabled via control register 417 (FIG. 3) is shown. Master reset conductor signal 603 is shown to remain inactive (high), and partial reset conductor signal 605 is shown to transition active. Master reset conductor signal 603 being inactive and partial reset conductor signal 605 being active indicates to integrated circuit 200 that power conservation mode should be entered. A time later as indicated by arrow 700, conductor signals 604 and 602 are powered off. In one embodiment, the amount of time necessary before powering off conductor signals 604 and 602 is five microseconds. Conductor signal 601 (coupled to core 203) is shown to remain powered, thus maintaining power for the internal core sections. In the embodiment of FIG. 3, for example, the RTC unit continues to function normally. If an input/output driver (as shown in FIG. 4) is configured with separate and distinct power supplies for conductors 501 and 504, conductor 501 must be powered off prior to or simultaneously to powering off conductor 504. Conductor signals 604 and 602 need not power off simultaneously as shown, but each conductor signal 604 and 602 must remain powered for the minimum time after partial reset conductor signal 605 transitions active.

Figure 7:
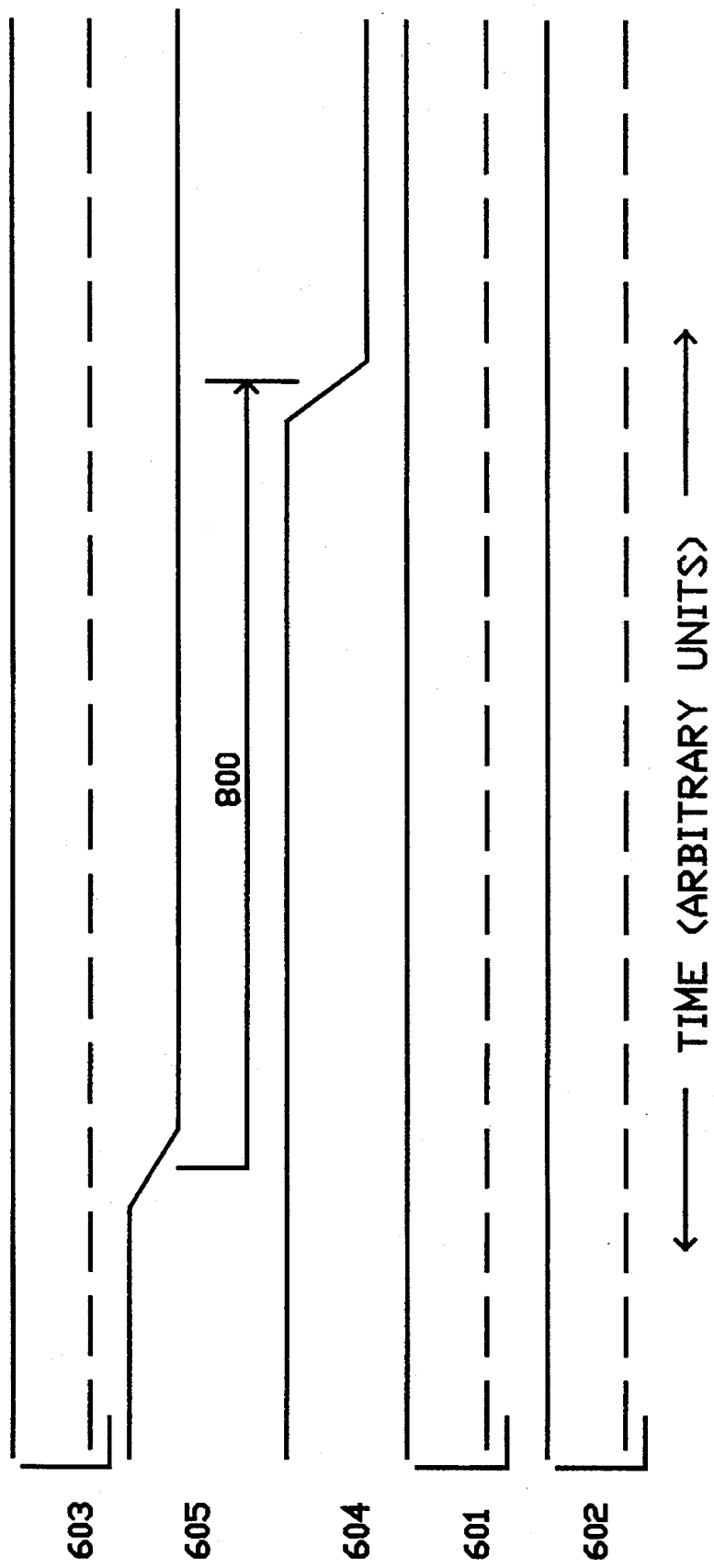
FIG. 7 is a timing diagram depicting a sequence of power and reset signal transitions for causing the integrated circuit shown in FIG. 3 (configured with DRAM refresh enabled during power conservation mode) to enter a power conservation mode of operation.

Turning now to FIG. 7, a timing diagram is shown for entering power conservation mode when DRAM refresh is enabled via control register 417 of the embodiment of FIG. 3. As with FIG. 6, master reset conductor signal 603 remains inactive (high) and partial reset conductor signal 605 is activated, indicating to integrated circuit 200 that power conservation mode should be entered. A time later as indicated by arrow 800 on FIG. 7, conductor signal 604 may be powered off. In one embodiment, the amount of time required before powering off conductor signal 604 is equal to two refresh cycles, where a refresh cycle is the amount of time between refreshes of the DRAM memory. This time is dependent on the DRAM modules 411 that are installed. Conductor signal 601 is shown to remain powered. Conductor signal 602 is shown to remain powered, so that refresh may occur and so that DRAM modules 411 remain powered. If an input/output driver is configured with separate and distinct power supplies for conductors 501 and 504, conductor 501 must be powered off prior to or simultaneously to powering off conductor 504.

Figure 8:
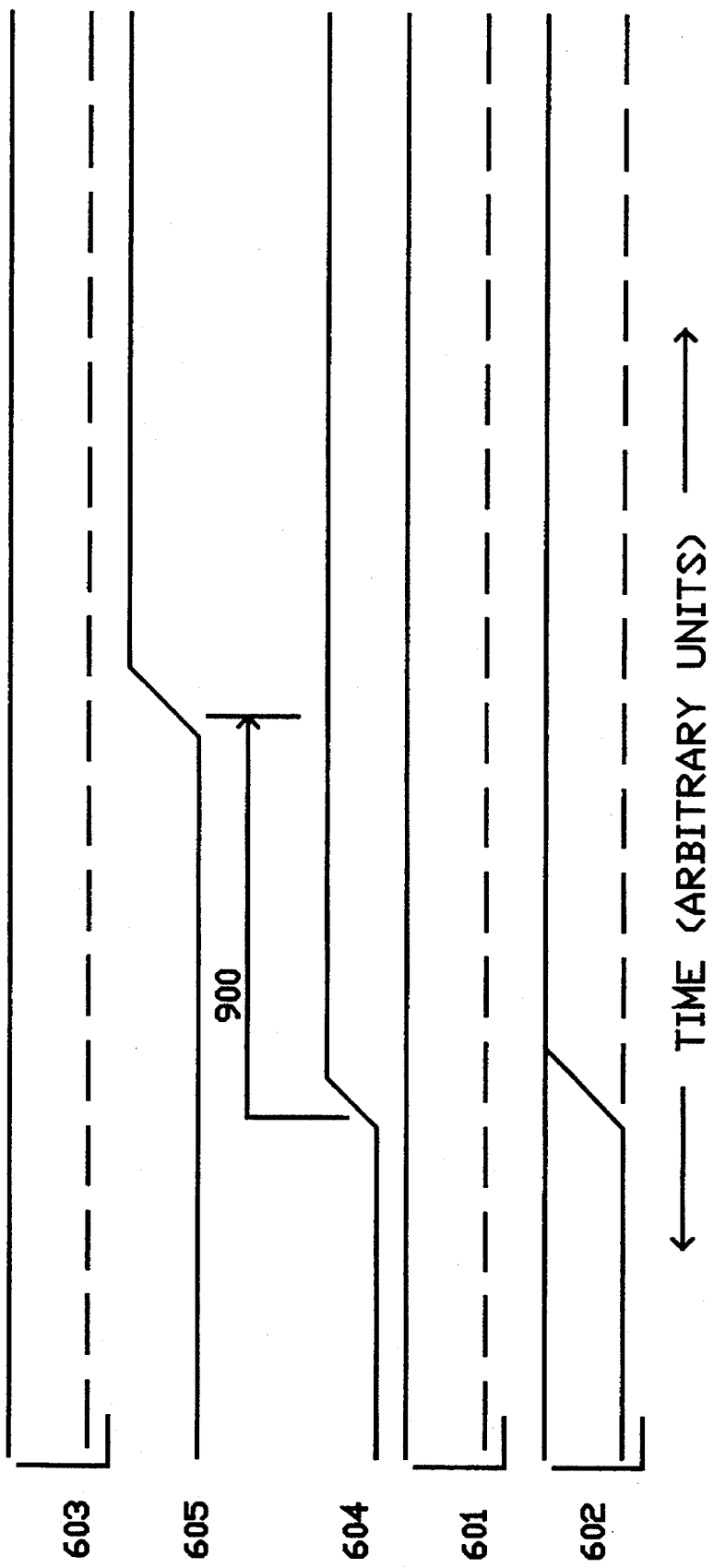
FIG. 8 is a timing diagram depicting a sequence of power and reset signal transitions for causing the integrated circuit shown in FIG. 3 to exit a power conservation mode of operation.

FIG. 8 shows a timing diagram for exiting power conservation mode for the embodiment of FIG. 3. Master reset conductor signal 603 is shown as inactive and partial reset conductor signal 605 is shown as transitioning inactive, indicating to integrated circuit 200 that power conservation mode should be exited. Before power conservation mode can be exited, conductor signals 604 and 602 must be powered on. A time indicated by arrow 900 on FIG. 8 must elapse after powering on conductor signals 604 and 602 before allowing partial reset conductor signal 605 to transition inactive. In one embodiment, the amount of time required is five microseconds. If an input/output driver is configured with separate and distinct power supplies for conductors 501 and 504, conductor 504 must be powered on before or simultaneous to powering on conductor 501. Once partial reset conductor signal 605 is inactive, integrated circuit 200 will return to normal operation.

Figure 9:
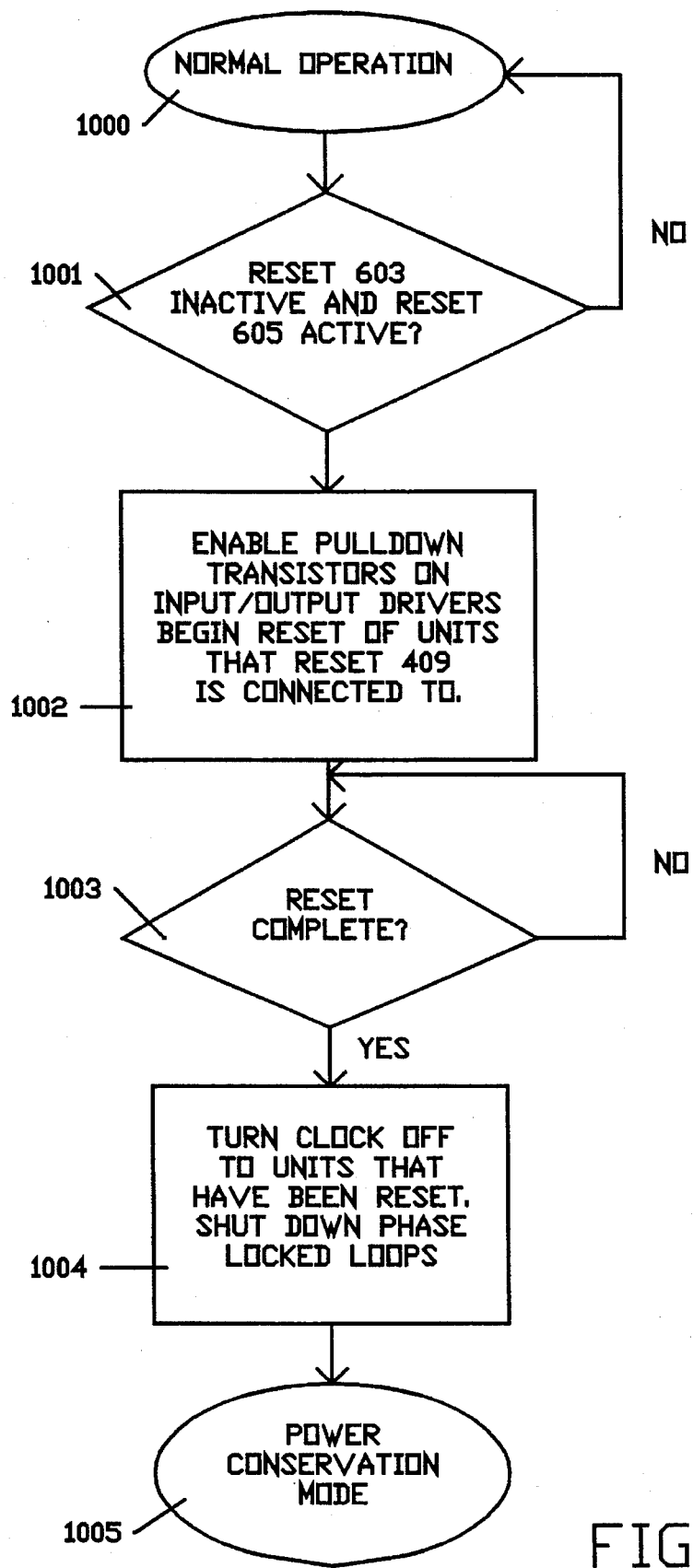
FIG. 9 is a decision flow graph depicting internal operations of the integrated circuit shown in FIG. 3 when the power conservation mode of operation is initiated.

Turning now to FIG. 9, a decision flow graph is shown for the process of entering power conservation mode in integrated circuit 200. Start terminal 1000 indicates that integrated circuit 200 is in normal operation. Decision box 1001 indicates that, during normal operation, the states of reset conductor signals 603 and 605 are examined. If master reset conductor signal 603 is inactive and partial reset conductor signal 605 is active, integrated circuit 200 begins the process of entering power conservation mode. Otherwise, the integrated circuit remains in normal operation. When entering power conservation mode, the steps shown in process box 1002 are performed. First, the pull-down transistor 510 of the driver circuit as shown in FIG. 4 is enabled by activating the force term signal, derived as discussed above. The pull-down transistor 510 is enabled for driver circuits associated with units that are to be reset by partial reset conductor signal 605. Second, a reset of the units coupled to partial reset conductor 409 is initiated. In the case were DRAM refresh is enabled, subunit 403 is reset. In the case were DRAM refresh is disabled, both subunit 403 and memory control unit 401 are reset. As shown by decision box 1003, integrated circuit 200 then waits for the reset to complete before proceeding.

When the reset is complete, the actions listed in process box 1004 are performed. In particular, clock control unit 418 disables the clock to subunit 403 and, if refresh is disabled, to memory control unit 401. If both subunit 403 and memory control unit 401 are reset, then the integrated circuit's phase locked loops (embodied in clock control unit 418) are also shutdown. The oscillator within clock control unit 418 clocks RTC block 402 and, optionally, memory control unit 401. After these actions have been completed, the integrated circuit is in power conservation mode as indicated in end terminal 1005.

Figure 10:
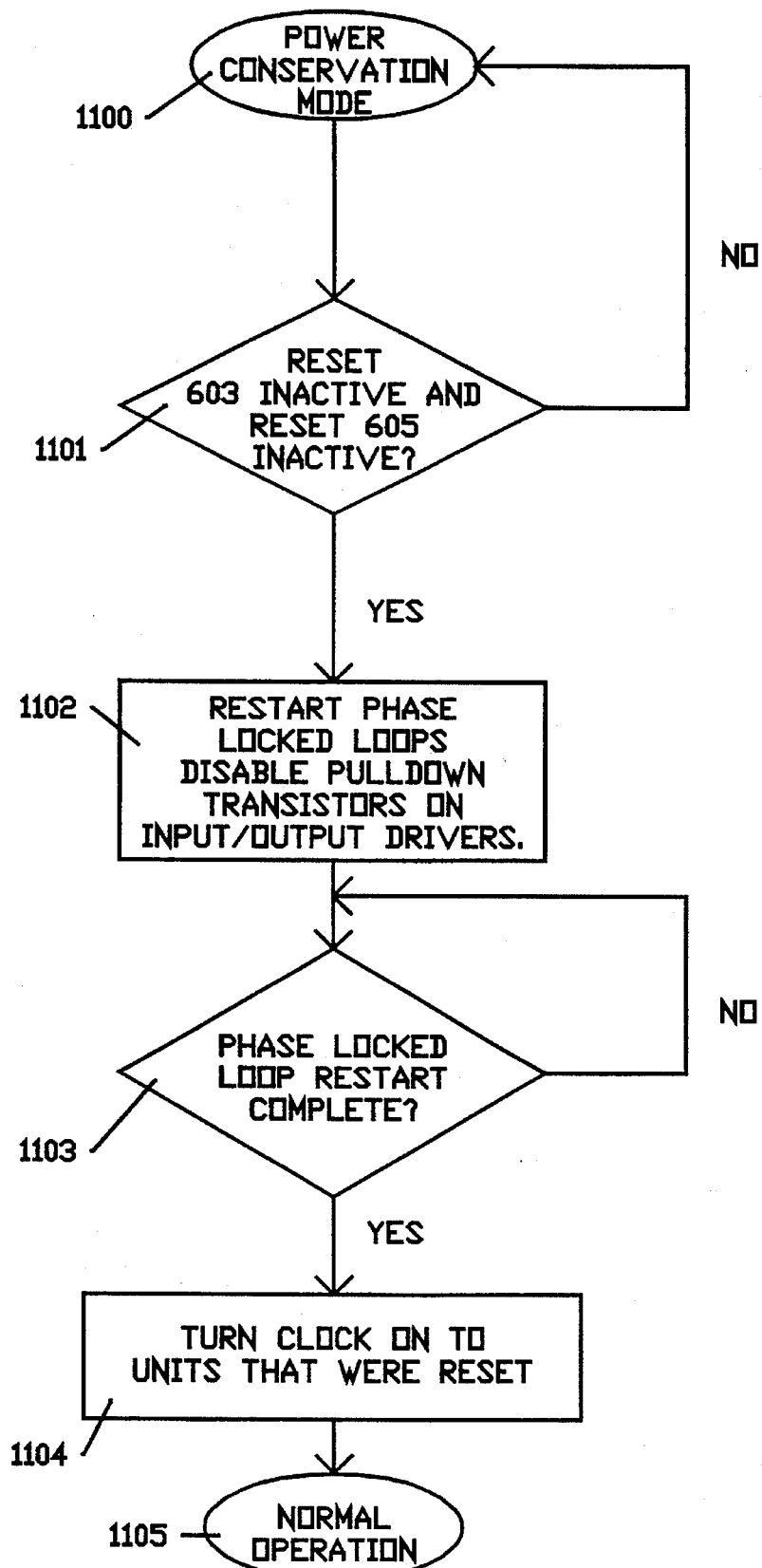
FIG. 10 is a decision flow graph depicting internal operations of the integrated circuit shown in FIG. 3 when the power conservation mode of operation is exited.

Turning now to FIG. 10, a decision flow diagram is shown for exiting power conservation mode in integrated circuit 200. As start terminal 1100 indicates, power conservation mode must be the state of integrated circuit 200 for the process shown in FIG. 10 to be executed. During power conservation mode, reset conductor signals 603 and 605 are examined. As indicated by decision box 1101, if both reset conductor signals 603 and 605 are inactive, then integrated circuit 200 initiates the process of returning to normal operation. Otherwise, the integrated circuit remains in power conservation mode. The first steps in the process of leaving power conservation mode are indicated in process box 1102: restarting of the phase locked loop circuits in clock circuit 418 is initiated and the pull-down transistors in the input/output driver circuits are disabled by deactivating the force term. Clock control unit 418 waits for the phase locked loop circuits to complete the restart sequence, as indicated by decision box 1103. Once the phase locked loop restart is completed, clock control unit 418 enables the clock to the units that had been reset when power conservation mode was entered, as shown in process box 1104. With the clocks enabled, integrated circuit 200 is in normal operation mode, as indicated by end terminal 1105.

Numerous variations and modifications will become apparent to those skilled in the art once the above disclosure is fully appreciated. It is intended that the following claims be interpreted to embrace all such variations and modifications.

What is claimed is:

1. An integrated circuit comprising:

an input/output driver circuit interposed between a core section and an input/output pad upon a single monolithic circuit, wherein said input/output driver circuit includes:

a pull-up transistor connected between a first power source and said input/output pad;

a pull-down transistor connected between a ground and said input/output pad; and a force term signal input into a gate of said pull-down transistor during times in which a partial reset is detected.

2. The integrated circuit as recited in claim 1, wherein said pull-up transistor is turned off during times in which said partial reset is detected.

3. The integrated circuit as recited in claim 1, wherein said pull-up transistor is turned on during times in which said partial reset is not detected.

4. The integrated circuit as recited in claim 1, wherein said input/output driver circuit further comprising:

a driving-high transistor connected between said first power source and said input/output pad;

a driving-low transistor connected between said ground and said input/output pad; and a pair of level translator/predriver circuits connected to respective gate terminals of said driving-high and driving low-transistors, wherein one of said level translator/predriver circuits coupled is to receive an output signal from said core section and to activate said driving-high transistor coupled thereto.

5. The integrated circuit as recited in claim 4, wherein activated said driving-high transistor causes coupling of said first power source to said input/output pad.

6. The integrated circuit as recited in claim 4, wherein activated said driving-low transistor causes coupling of said ground to said input/output pad.

7. The integrated circuit as recited in claim 1, wherein said input/output pad is electrically coupled to a lead extending from a package surrounding said integrated circuit.

8. The integrated circuit as recited in claim 1, further comprising a plurality of input/output driver circuits within an input/output section, each input/output driver circuit is coupled between a portion of said core and an input/output pad.

9. An input/output driver circuit coupled between a core section and an input/output pad, said input/output driver circuit comprising:

selectively operable pull-up and pull-down transistors connected in series between a first power source and a ground;

selectively operable driving-high transistor and driving-low transistors connected in series between said ground and both said first power source as well as a clamped second power source; and a mechanism for permitting deactivation of said first and second power sources and for activating said pull-down transistor at substantially the same time as said first and second power sources are deactivated.

10. The input/output driver circuit as recited in claim 9, wherein said input/output pad is connected within the series path between said pull-up and pull-down transistors and is further connected within the series path between said driving-high transistor and said driving-low transistor.

11. The input/output driver circuit as recited in claim 9, further comprising a translator/predriver circuit connected between said core section and a gate terminal of each said driving-low and driving-high transistors.

12. The input/output driver circuit as recited in claim 9, wherein said clamped second power source comprises:

a first diode arranged between a source terminal of said driving-high transistor and said second clamped power source; and a second diode arranged between a drain terminal of said driving-high transistor and said second clamped power source.

13. The input/output driver circuit as recited in claim 9, wherein said mechanism comprises a switch within a power supply which provides said first and second power sources, said switch is adapted for disconnecting said first and second power sources from said driving-high transistor.

14. The input/output driver circuit as recited in claim 9, wherein said mechanism comprises a circuit within said core which produces a force term signal responsive to user input upon a pair of input pins configured upon said integrated circuit.

15. The input/output driver circuit as recited in claim 14, wherein said force term signal is coupled onto a gate terminal of said pull-down transistor.

* * * * *